United States Patent
Rolston

(10) Patent No.: US 12,127,351 B2
(45) Date of Patent: Oct. 22, 2024

(54) METHOD AND ASSEMBLY FOR BOARD TO BOARD CONNECTION OF ACTIVE DEVICES

(71) Applicant: Smiths Interconnect Canada Inc., Kirkland (CA)

(72) Inventor: David R. Rolston, Beaconsfield (CA)

(73) Assignee: Smiths Interconnect Canada Inc., Kirkland (CA)

( * ) Notice: Subject to any disclaimer, the term of this patent is extended or adjusted under 35 U.S.C. 154(b) by 205 days.

(21) Appl. No.: 17/433,649

(22) PCT Filed: Feb. 25, 2020

(86) PCT No.: PCT/CA2020/050239
§ 371 (c)(1),
(2) Date: Aug. 25, 2021

(87) PCT Pub. No.: WO2020/172743
PCT Pub. Date: Sep. 3, 2020

(65) Prior Publication Data
US 2022/0151079 A1 May 12, 2022

Related U.S. Application Data

(60) Provisional application No. 62/810,062, filed on Feb. 25, 2019.

(51) Int. Cl.
*H05K 3/36* (2006.01)
*H01L 25/065* (2023.01)

(52) U.S. Cl.
CPC ......... *H05K 3/365* (2013.01); *H01L 25/0657* (2013.01)

(58) Field of Classification Search
CPC ..... H05K 3/365; H01L 25/0657; H10B 80/00
See application file for complete search history.

(56) References Cited

U.S. PATENT DOCUMENTS

| | | | |
|---|---|---|---|
| 4,997,377 | A | 3/1991 | Goto |
| 6,343,171 | B1 | 1/2002 | Yoshimura et al. |
| 7,442,050 | B1 | 10/2008 | Bhakta |
| 2002/0179331 | A1 | 12/2002 | Brodsky et al. |
| 2002/0197043 | A1* | 12/2002 | Hwang ............... H01R 13/659 385/134 |
| 2003/0156396 | A1 | 8/2003 | Pearson et al. |
| 2003/0222282 | A1 | 12/2003 | Fjelstad et al. |

OTHER PUBLICATIONS

Extended European Search Report issued in European Patent Application No. 20763303.3, dated Oct. 19, 2022, 7 pages.
International Search Report and Written Opinion of the International Search Authority, Forms PCT/ISA/210 and PCT/ISA/237, PCT/CA2020/050239, dated May 6, 2020, 6 pages.

* cited by examiner

*Primary Examiner* — Timor Karimy
(74) *Attorney, Agent, or Firm* — Armstrong Teasdale LLP

(57) ABSTRACT

A method and assembly for board to board connection of active devices are described herein. The assembly comprises first and second superposed active devices, a first interfacing member electrically coupled to the first active device, and a flexible printed wiring board having a first end and a second end, the first end electrically coupled to the first interfacing member.

13 Claims, 5 Drawing Sheets

METHOD AND ASSEMBLY FOR BOARD TO BOARD CONNECTION OF ACTIVE DEVICES

CROSS-REFERENCE TO RELATED APPLICATIONS

The present application claims the benefit of U.S. Provisional Patent Application No. 62/810,062 filed on Feb. 25, 2019, the contents of which are hereby incorporated by reference.

TECHNICAL FIELD

The present disclosure relates generally to active devices interconnected between boards, and more particularly to small form factor connection of active devices.

BACKGROUND OF THE ART

Embedded transceivers are chip-sized components that offer high bandwidth for short reach applications. These transceivers can be soldered or socketed to a printed circuit board and are well suited for small, compact systems requiring high input/output (I/O) density and small spaces.

Real estate on the printed circuit board is a high value commodity as there is a need to maximize the space for optimal use. However, an additional constraint when transmitting large amounts of data through the transceivers is how to maintain signal integrity in such restricted spaces.

Therefore, improvements are needed.

SUMMARY

In accordance with a broad aspect, there is provided an assembly comprising a first active device, a second active device stacked with the first active device, a first interfacing member electrically coupled to the first active device, and a flexible printed wiring board having a first end and a second end, the first end electrically coupled to the first interfacing member, the second end extending away from the stacked first and second active devices.

In an embodiment according to any of the previous embodiments, the first interfacing member comprises a coupling plate and a base supporting the coupling plate.

In an embodiment according to any of the previous embodiments, the first end of the flexible printed wiring board is interposed between the base and the coupling plate of the first interfacing member.

In an embodiment according to any of the previous embodiments, the first interfacing member is interposed between the first active device and the second active device and is electrically coupled to the first active device via a bottom surface of the first active device.

In an embodiment according to any of the previous embodiments, the first interfacing member has a same form factor as the first active device and the second active device.

In an embodiment according to any of the previous embodiments, the first active device comprises a first connecting end on a first side surface thereof, and the second active device comprises a second connecting end on a second side surface thereof.

In an embodiment according to any of the previous embodiments, the assembly further comprises a first board coupled to the first active device and the second active device through the first connecting end and the second connecting end, respectively.

In an embodiment according to any of the previous embodiments, the first board is a connector board.

In an embodiment according to any of the previous embodiments, the assembly further comprises a second interfacing member electrically coupled to the second active device.

In an embodiment according to any of the previous embodiments, the second interfacing member is electrically coupled to the second active device via a bottom surface of the second active device.

In an embodiment according to any of the previous embodiments, the assembly further comprises a second board electrically coupled to the second active device and to the second end of the flexible printed wiring board.

In an embodiment according to any of the previous embodiments, the assembly further comprises a second interfacing member interposed between the second active device and the second board.

In an embodiment according to any of the previous embodiments, the assembly further comprises an attachment member securing the second end of the flexible printed wiring board to the second board.

In an embodiment according to any of the previous embodiments, the assembly further comprises a third interfacing member interposed between the second end of the flexible printed wiring board and the second board.

In an embodiment according to any of the previous embodiments, the first active device and the second active device are identical.

In accordance with another broad aspect, there is provided a method for transmitting a plurality of signals from a first board to a second board through a plurality of active devices. The method comprises transmitting a first set of signals from the first board to a first active device through a flexible printed wiring board electrically coupled to the first active device; transmitting a second set of signals from the first board to a second active device stacked with the first active device; and transmitting the first set of signals and the second set of signals from the first active device and the second active device, respectively, to the second board.

In an embodiment according to any of the previous embodiments, transmitting the first set of signals from the first board to the first active device comprises transmitting through a first interfacing member electrically coupling the flexible printed wiring board to the first active device.

In an embodiment according to any of the previous embodiments, transmitting the second set of signals from the first board to the second active device comprises transmitting the second set of signals through a second interfacing member electrically coupling the second active device and the first board.

In an embodiment according to any of the previous embodiments, transmitting the second set of signals from the first board to the second active device comprises transmitting the second set of signals directly to the second active device through a bottom surface thereof.

In an embodiment according to any of the previous embodiments, transmitting the first set of signals from the first board to the first active device comprises transmitting through a third interfacing member electrically coupling the flexible printed wiring board to the to the first board.

Any of the above features may be used together, in any combination.

BRIEF DESCRIPTION OF THE DRAWINGS

Reference is now made to the accompanying FIGS. in which.

It will be noted that throughout the appended drawings, like features are identified by like reference numerals.

DETAILED DESCRIPTION

There is described herein an assembly for interconnecting active devices between two boards. The active devices may be any type of circuit component with the ability to electrically control electron flow, such as but not limited to a transistor, a transceiver, a microchip, a silicon-controlled rectifier (SCR), a triac, and a vacuum tube. The active devices may be any type of circuit component with the ability to control photon flow, such as semiconductor lasers, photodetectors, LEDs or VCSELs. The active devices may be current-controlled devices, voltage-controlled devices, or both. The active devices may be single active components or a plurality of components composed of one or more active components and one or more passive components. The active devices may be packaged as chips or modules, or unpackaged. In some embodiments, the active devices are optical transceivers operating at ultra-high-speed, such as 12.5 to 28 Gbps, and having multiple lanes.

Figure 1:
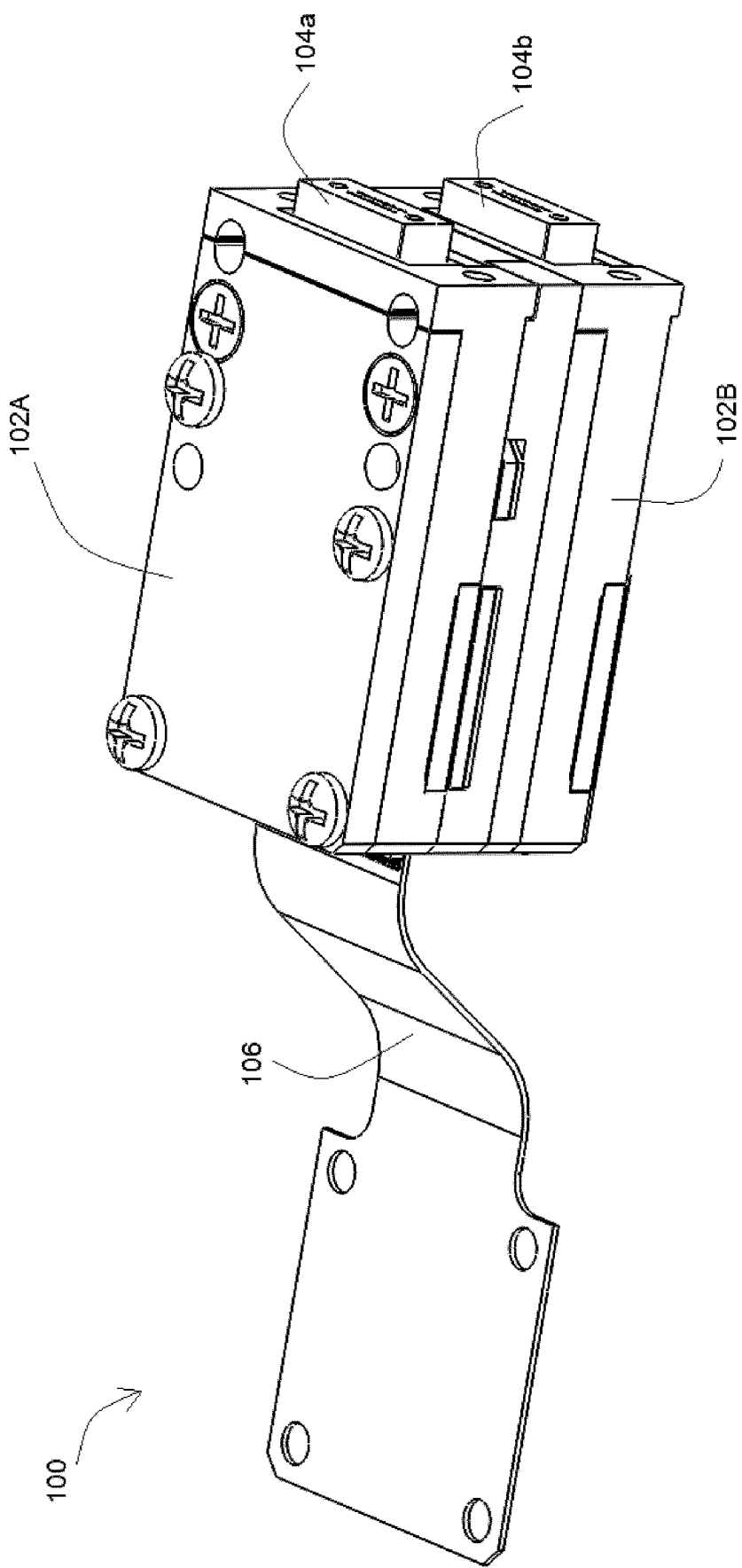
FIG. 1 is a schematic illustration of an assembly for board to board connection of active devices, in accordance with some embodiments.

FIG. 1 illustrates an example assembly 100. A first active device 102a is superposed on a second active device 102b. Although the embodiments described herein refer to two stacked active devices 102a, 102b, more than two active devices may be stacked using the principles described herein. The active devices 102a, 102b may be the same or different. The active devices 102a, 102b, each comprise a connecting end 104a, 104b, respectively, for coupling the active devices 102a, 102b to a first board, for example a connector board. A flexible printed wiring board (PWB) 106 couples the upper active device 102a to a second board, for example a device board.

The first board, or connector board, may be a printed circuit board or simply a substrate to act as a mechanical support for a plurality of connectors. In some embodiments, the first board is a backplane. In some embodiments, the first board is a motherboard, a midplane, or a riser card. Other embodiments may also apply. The second board, or device board, may be an expansion card, an expansion board, an adapter card, an accessory card, a daughter card or any other type of printed circuit board. The assembly 100 is configured for transmitting a plurality of signals from the second board to the first board or vice versa.

A flexible printed wiring board (PWB) 106, also known as a flex circuit, a flexible printed circuit board, a flex print, and flexi-circuit, is an interconnecting member having conductive circuit patterns supported on a thin, flexible substrate, allowing the flexible PWB 106 to conform to a desired shape or to flex during its use. Example materials for the substrate are polyimide, PEEK, and transparent conductive polyester. The flexible PWB 106 may be of various types, including but not limited to one metal layer, single-sided, double sided, double access, back-bared, sculptured, and multilayer. The flexible PWB 106 may be a rigid flex circuit or a flat flexible circuit, such as a flat flexible cable. The conductive circuit patterns may be formed by etching metal foil cladding, such as copper, from polymer bases, plating metal, or printing of conductive inks, among other processes. A coating may be provided on the conductive circuit patterns for protection. In some embodiments, components are attached to the flexible PWB 106.

Figure 2:
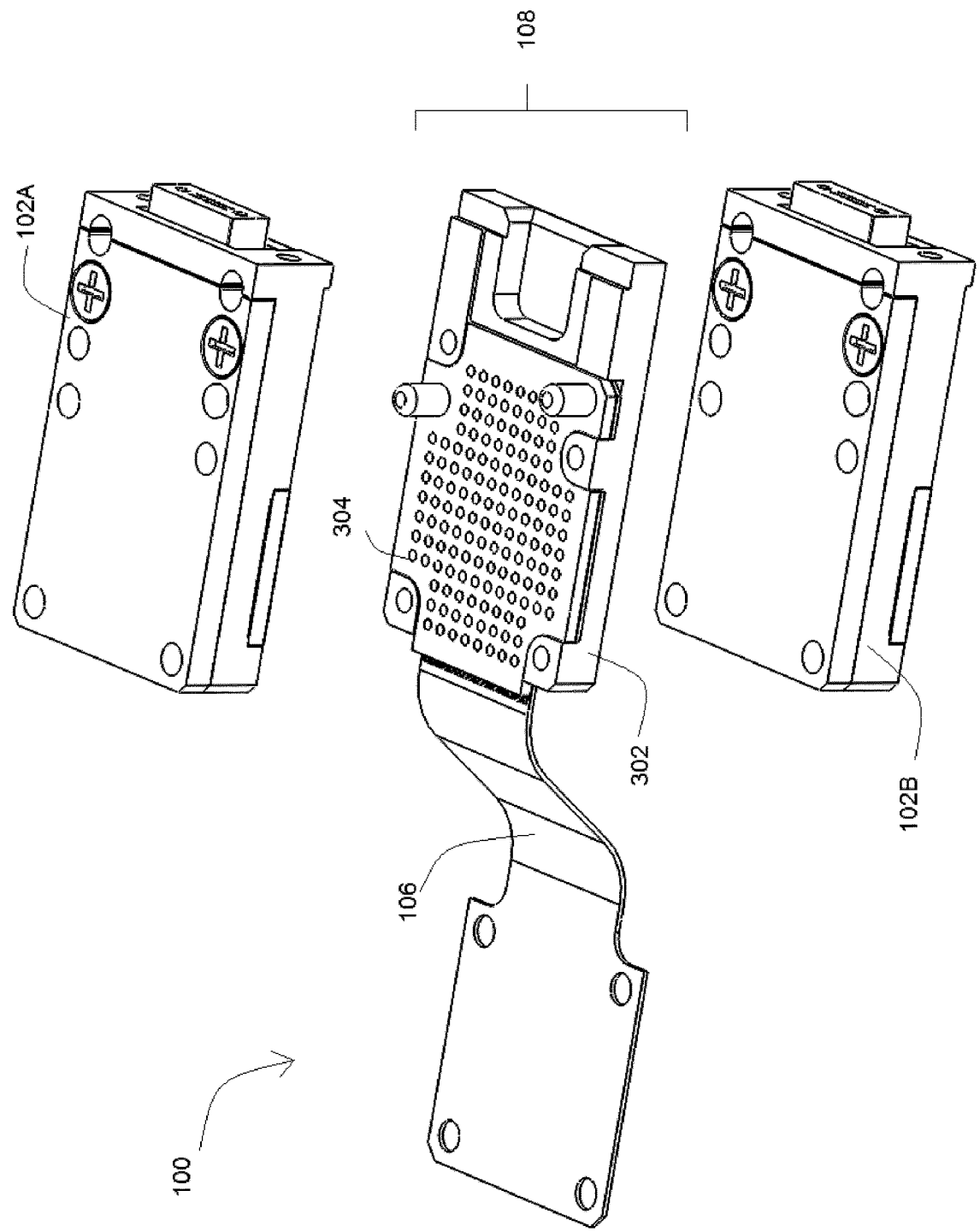
FIG. 2 is an exploded view of the assembly of FIG. 1, in accordance with some embodiments.

Referring now to FIG. 2, there is shown an exploded view of the assembly 100. An interfacing member 108 is interposed between the first (and upper) active device 102a and the second (and lower) active device 102b, and is electrically coupled to the first active device 102a. In some embodiments, the interfacing member 108 is electrically coupled to a top surface of the first active device 102a instead of being interposed between the first and second active devices 102a, 102b. In some embodiments, the interfacing member 108 is electrically coupled to a side surface of the first active device 102a. It will be understood that the embodiment illustrated is merely one way of coupling the interfacing member 108 to the first active device 102a.

In some embodiments, the interfacing member 108 is shaped similarly to the active devices 102a, 102b so as to preserve the form factor of the assembly 100. Alternatively, the interfacing member 108 may have a differing shape, such as wider or narrower than the active devices 102a, 102b, or longer or shorter than the active devices 102a, 102b.

The interfacing member 108 may be a single piece or may be multiple pieces that together form the interfacing member 108, as shown in the example of FIG. 2. A base 302 supports a coupling plate 304. With additional reference to FIG. 3, the coupling plate 304 electrically couples one end 305 of the flexible PWB 106 to the first active device 102a. The end 305 of the flexible PWB 106 is sandwiched between the coupling plate 304 and the base 302. A slot 308 on the base 302 is shaped to receive the end 305 of the flexible PWB 106 and the plate 304. Pins 306a, 306b are received in holes 310a, 310b, respectively, of the base 302 to secure the end 305 of the flexible PWB 106 and the coupling plate 304 to the base 302. It will be understood that pins 306a, 306b and holes 310a, 310b are merely one example of means to secure the flexible PWB 106 to the interfacing member 108. In some embodiments, the end 305 of the flexible PWB 106 is sandwiched between a top surface of the second active device 102b and an interfacing member 108 having only a coupling plate 304 and no base 302. Other embodiments are also considered.

Figure 4:
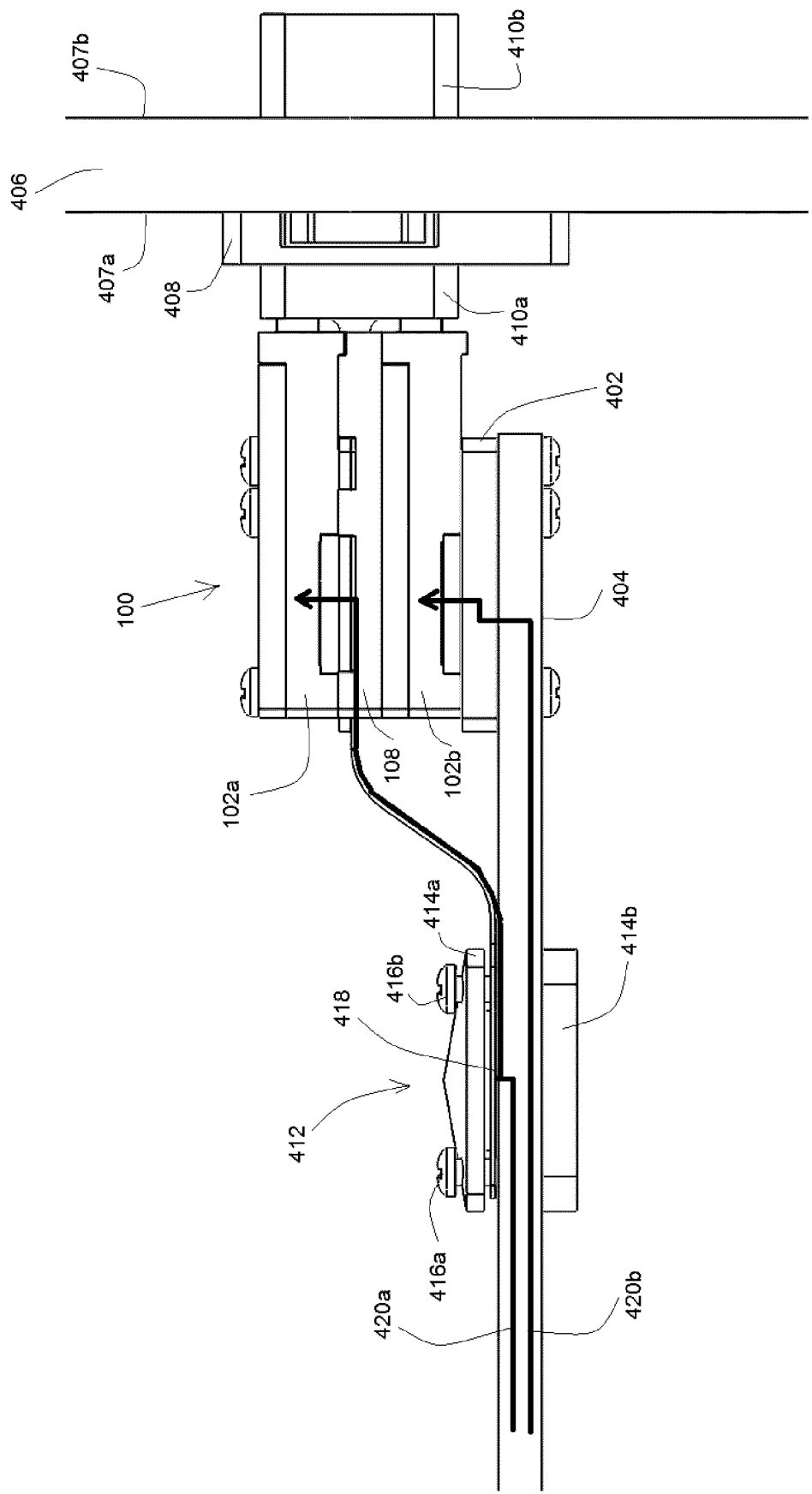
FIG. 4 is a side view of the assembly of FIG. 1 as connected to first and second boards, in accordance with some embodiments.

Referring to FIG. 4, there is illustrated an example embodiment of the assembly 100 coupled to a connector board 406 and a device board 404. In some embodiments, the second active device 102b is adapted for direct coupling to the device board 404, for example using surface-mount technology or through-hole technology. Alternatively, a second interfacing member 402 electrically couples the second active device 102b to the device board 404. The second interfacing member 402 may be any surface-mount device. For example, the second interfacing member 402 may be a land grid array (LGA) electrically connected to the device board 402 via a socket or soldered directly to the device board 404. In another embodiment, the flexible PWB 106 may be connected to a mezzanine board that is also connected to the device board 404, allowing for two different sources of signals feeding the assembly 100. Other embodiments are also considered to allow the second active device 102b to electrically couple to the device board 404.

The first active device 102a is coupled to the device board 404 via the flexible PWB 106. More specifically, the flexible PWB 106 has a first end 305 electrically coupled to the interfacing member 108 that is itself electrically coupled to the first active device 102a, and a second end 307 electrically coupled to the device board 404. In this manner, the second active device 102b is electrically coupled to the device board 404 either directly or via interfacing member 402, and the first active device 102a is electrically coupled to the device board 404 via the flexible PWB 106 and the interfacing member 108. This allows signals coming from the device board 404 to reach the first active device 102a more smoothly and directly than having to go through other types of connectors and/or through the second active device 102b.

In the example of FIG. 4, the connector board 406 has a front side 407a and a back side 407b and is assembled with a connector 408. In some embodiments, the connector 408 is attached to the front side 407a of the connector board 406. In some embodiments, the connector 408 is embedded in the connector board 406 and extends from the front side 407a to the back side 407b. In some embodiments, the connector 408 is embedded in the connector board 406 and extends partially through the connector board 406 from the front side 407a towards the back side 407b. The connector 408 has a mating end 410a that extends outwardly from the front side 407a of the connector board 406, for mating with the active devices 102a, 102b. In some embodiments, a back end 410b of the connector 408 extends outwardly from the back side 407b of the connector board 406. In some embodiments, the connector 408 is a floating connector designed to move slightly to account for misalignments.

The connector 408 may be any type of electrical, optical, electro-optic, or opto-electric connector. In the case of an optical connector, the mating end 410a may comprise a ferrule and/or a coupling mechanism. Materials for the connector 408 include but are not limited to aluminum, stainless steel, and plastic. Examples for the optical connector 408 include multi-terminal (MT) plastic and zirconia single-fiber ferrule, as used in connector assemblies such as the single-connector (SC), and Lucent-Connector (LC). Note that while a single connector 408 is illustrated for coupling with the active devices 102a, 102b, two separate connectors may also be provided.

In some embodiments, an attachment member 412 is used to secure the second end 307 of the flexible PWB 106 (see FIG. 3) to the device board 404. For example, a top plate 414a and a bottom plate 414b are retained to the device board 404 with first and second screws 416a, 416b that extend through the device board 404. Other types of attachment members are also considered. In some embodiments, another interfacing member 418 is provided between the second end 307 of the flexible PWB 106 and the device board 404 to electrically couple the flexible PWB 106 to the device board 404. Alternatively, components for electrical coupling are provided directly on the flexible PWB 106. Also alternatively, the second end 307 is soldered onto the device board 404.

Figure 5:
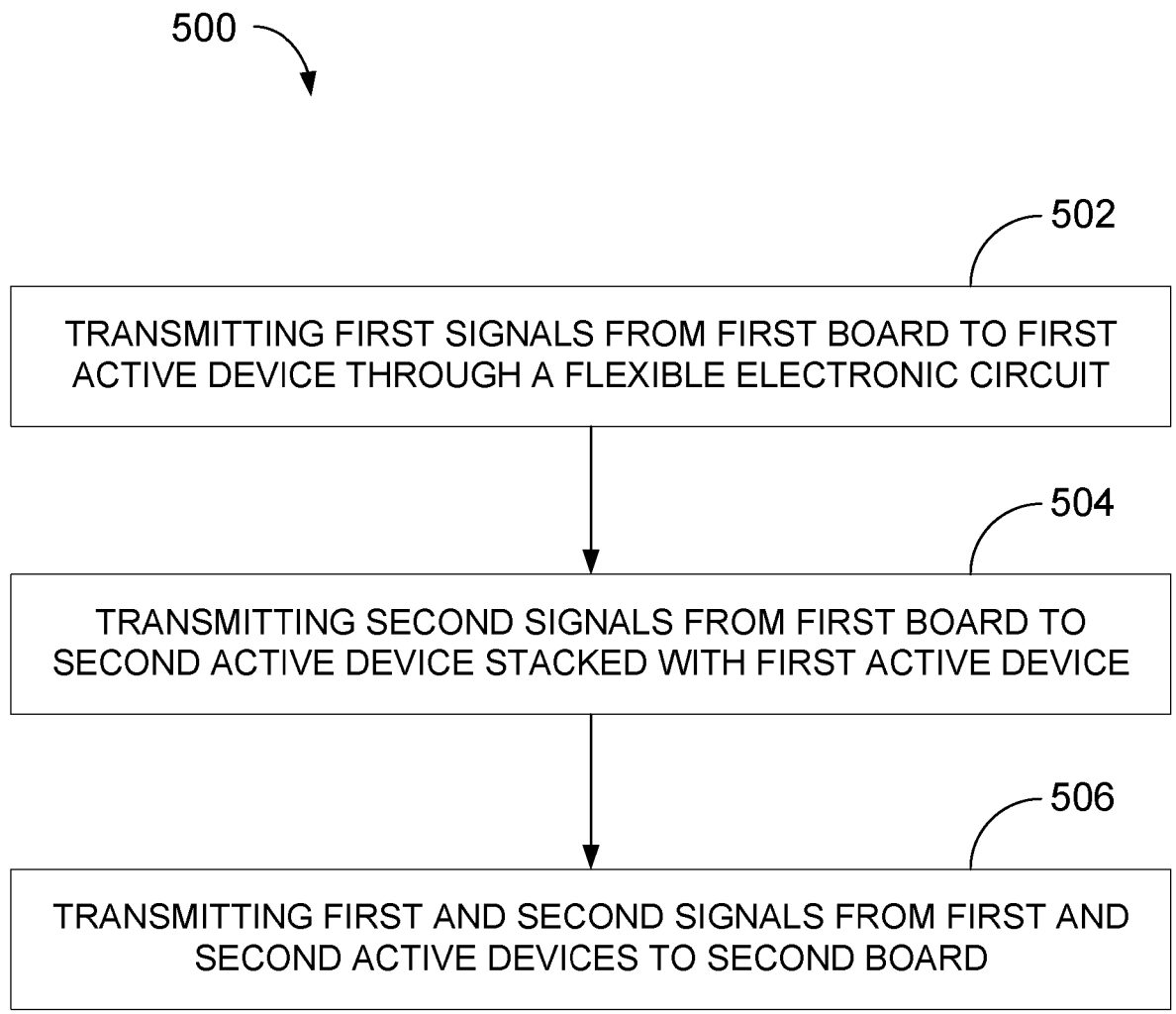
FIG. 5 is a flowchart of a method for transmitting signals from board to board through active devices, in accordance with some embodiments.

With reference to FIG. 5, there is illustrated a flowchart of a method 500 for transmitting a plurality of signals from a first board, such as device board 404 to a second board, such as connector board 406, through two or more active devices. At step 502, a first set of signals are transmitted from the first board to a first active device through a flexible PWB. In some embodiments, the first set of signals are transmitted through a first interfacing member electrically coupling the flexible PWB to the first active device. In some embodiments, the first set of signals are transmitted through a third interfacing member electrically coupling the flexible PWB to the first board. In some embodiments, both the first and the third interfacing members are used.

An example embodiment is illustrated in FIG. 4, where electrical signals 420a flow from the device board 404, through the flexible PWB 106, and into the upper active device 102a through the interfacing member 108. The flexible PWB 106 and the interfacing member 108 may be interposed between the first active device 102a and the second active device 102b.

At step 504, a second set of signals are transmitted from the first board to a second active device stacked with the first active device. In some embodiments, the second set of signals are transmitted from the first board directly to the second active device through a bottom surface thereof. Alternatively, a second interfacing member may be interposed between the second active device and the first board, and the second set of signals are transmitted through the second interfacing member.

An example embodiment is illustrated in FIG. 4, where electrical signals 420b flow from the device board 404 to the lower active device 102b. In the embodiment illustrated, the lower active device 102 is electrically coupled to the device board 404 via interfacing member 402.

At step 506, the first and second sets of signals are transmitted from the first and second active devices, respectively, to the second board. As shown in FIG. 4, the active devices 102a, 102b may be coupled to the mating end 410a of the connector 408 mounted to the connector board 406. Alternatively, each active device 102a, 102b, mates with its own connector mounted to the connector board 406.

Figure 3:
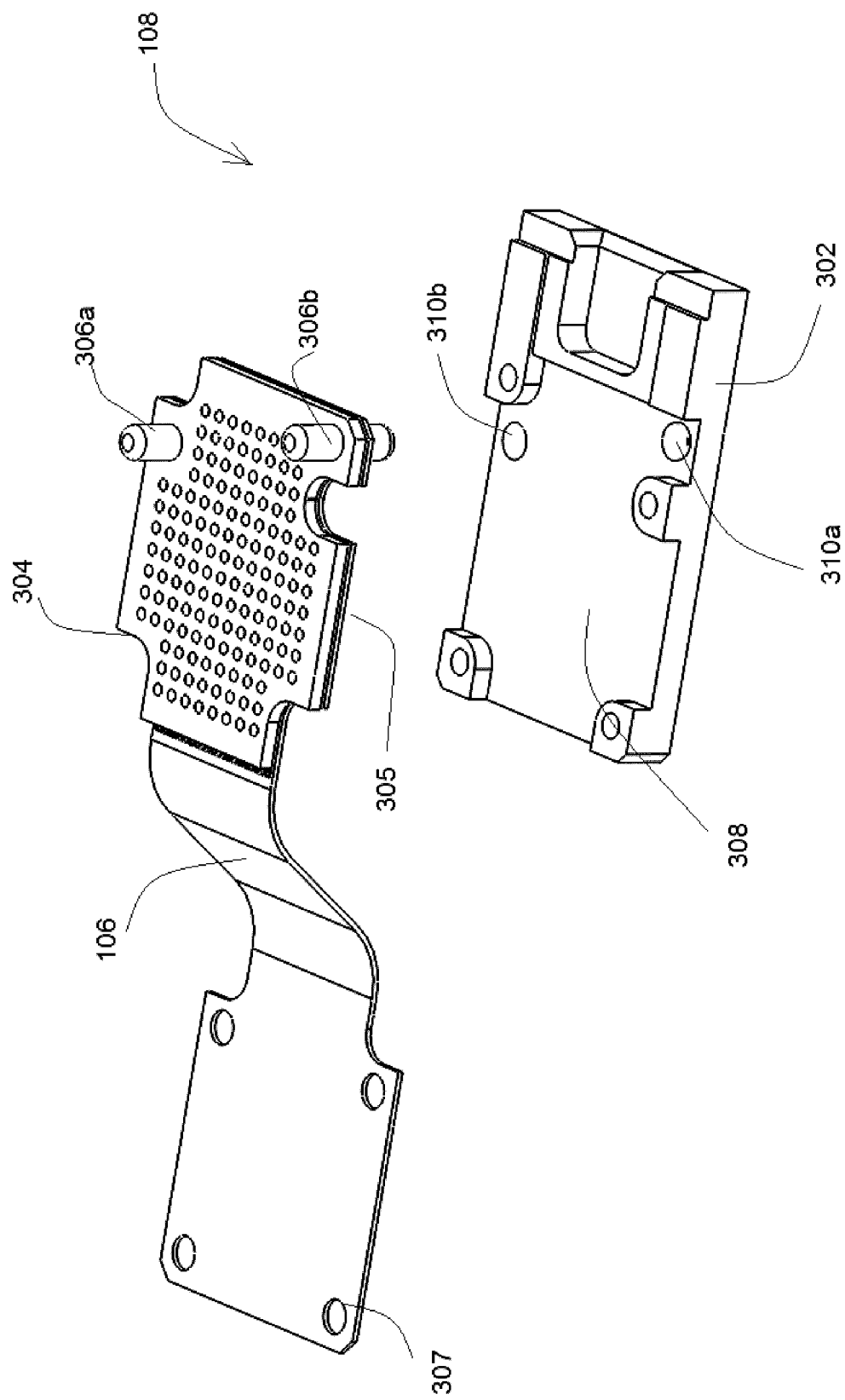
FIG. 3 is an exploded view of an interfacing member and flexible printed wiring board, in accordance with some embodiments.

In this manner, two or more active devices are stacked vertically, thus reducing the footprint occupied on the device board by the active devices. Electrical signals from the device board are sent to the lower active device directly or via an interfacing member, such as a land grid array or another type of contact grid. Electrical signals from the device board are sent to the upper active device through a PWB, which provides better signal integrity than using a pin or post that extends from the device board to the upper active device. Additional active devices may be stacked above the upper active device and coupled to the device board using separate and dedicated flexible PWBs. Each flexible PWB may be retained within the assembly 100 by having one end held between pairs of active devices. In some embodiments, each flexible PWB is received between a coupling plate and a base of an interfacing member, as shown in FIG. 3.

The active devices may have varying amounts of lanes, such as but not limited to 4 lanes, 8 lanes, and 12 lanes. The active devices may operate at various speeds, such as 12.5 Gbps, 25 Gbps, 28 Gbps, etc. In some embodiments, the stacked active devices are optical transceivers. In some embodiments, the flexible PWB are transmission cables that operate at ultra-high-speed, such as 25 Gbps. Other embodiments are also considered. For example, the assembly 100 may be used with surface mount embedded optical modules having 8 lanes of 12.5 Gbps bandwidth in a chip-size package featuring either surface-mount technology or Meg-Array connectors. In another example, the active devices are low-profile screw-in modules that mount to the board via an LGA connector, and that operate at 12.5 Gbps or 28 Gbps per lane. In yet another example, the lower active device is a 12 lane transmitter and the upper active device is a 12 lane receiver, or vice versa. It will be understood that the assembly 100 described herein may be used for ultra-high-speed data communications and computing applications where ultra-high-density I/O is desired.

The above description is meant to be exemplary only, and one skilled in the art will recognize that changes may be made to the embodiments described without departing from the scope of the invention disclosed. Still other modifications which fall within the scope of the present invention will be apparent to those skilled in the art, in light of a review of this disclosure.

Various aspects of the assembly and method described herein may be used alone, in combination, or in a variety of arrangements not specifically discussed in the embodiments described in the foregoing and is therefore not limited in its application to the details and arrangement of components set forth in the foregoing description or illustrated in the drawings. For example, aspects described in one embodiment may be combined in any manner with aspects described in other embodiments. Although particular embodiments have been shown and described, it will be apparent to those skilled in the art that changes and modifications may be made without departing from the disclosure in its broader aspects. The scope of the following claims should not be limited by the embodiments set forth in the examples, but should be given the broadest reasonable interpretation consistent with the description as a whole.

The invention claimed is:

1. An assembly comprising:
a first active device;
a second active device stacked with the first active device;
a first interfacing member electrically coupled to the first active device, wherein the first interfacing member comprises a coupling plate and a base supporting the coupling plate; and
a flexible printed wiring board having a first end and a second end, the first end electrically coupled to the first interfacing member, the second end extending away from the stacked first and second active devices, wherein the first end of the flexible printed wiring board is interposed between the base and the coupling plate of the first interfacing member.

2. The assembly of claim 1, wherein the first interfacing member is interposed between the first active device and the second active device and is electrically coupled to the first active device via a bottom surface of the first active device.

3. The assembly of claim 1, wherein the first interfacing member has a same form factor as the first active device and the second active device.

4. The assembly of claim 1, wherein the first active device comprises a first connecting end on a first side surface thereof, and the second active device comprises a second connecting end on a second side surface thereof.

5. The assembly of claim 4, further comprising a first board coupled to the first active device and the second active device through the first connecting end and the second connecting end, respectively.

6. The assembly of claim 5, wherein the first board is a connector board.

7. The assembly of claim 1, further comprising a second interfacing member electrically coupled to the second active device.

8. The assembly of claim 7, wherein the second interfacing member is electrically coupled to the second active device via a bottom surface of the second active device.

9. The assembly of claim 1, further comprising a second board electrically coupled to the second active device and to the second end of the flexible printed wiring board.

10. The assembly of claim 9, further comprising a second interfacing member interposed between the second active device and the second board.

11. The assembly of claim 9, further comprising an attachment member securing the second end of the flexible printed wiring board to the second board.

12. The assembly of claim 9, further comprising an additional interfacing member interposed between the second end of the flexible printed wiring board and the second board.

13. The assembly of claim 1, wherein the first active device and the second active device are identical.

* * * * *